(12) United States Patent
Chiang

(10) Patent No.: US 6,495,425 B1
(45) Date of Patent: Dec. 17, 2002

(54) MEMORY CELL STRUCTURE INTEGRATING SELF ALIGNED CONTACT STRUCTURE WITH SALICIDE GATE ELECTRODE STRUCTURE

(75) Inventor: Min-Hsiung Chiang, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/933,442

(22) Filed: Aug. 20, 2001

(51) Int. Cl.⁷ .............................................. H01L 21/20
(52) U.S. Cl. ...................... 438/305; 438/386
(58) Field of Search ..................... 438/14, 386, 305, 438/243, 246; 257/296

(56) References Cited

U.S. PATENT DOCUMENTS 6,096,595 A    8/2000   Huang
6,200,873 B1 * 3/2001 Shchrems ................ 438/386
6,265,274 B1 * 7/2001 Huang .................... 438/305
6,303,953 B1 * 10/2001 Doan ...................... 257/296

\* cited by examiner

Primary Examiner—John F. Niebling
Assistant Examiner—Andre' C. Stevenson
(74) Attorney, Agent, or Firm—Tung & Associates

(57) ABSTRACT

Within a method for fabricating a memory cell structure there is formed both: (1) a self aligned contact structure accessing a source/drain region within a field effect transistor (FET) device; and (2) a silicide layer upon a gate electrode within the field effect transistor (FET) while employing a salicide method. The self aligned contact structure provides that the memory cell structure may be fabricated with decreased dimensions. The silicide layer formed employing the salicide method provides the memory cell structure with enhanced performance. The method is particularly useful for fabricating memory cell structures embedded within logic circuits.

12 Claims, 3 Drawing Sheets

MEMORY CELL STRUCTURE INTEGRATING SELF ALIGNED CONTACT STRUCTURE WITH SALICIDE GATE ELECTRODE STRUCTURE

BACKGROUND OF THE INVENTION

1. Field of the Invention

The present invention relates generally to memory cell structures formed within microelectronic fabrications. More particularly, the present invention relates to enhanced performance memory cell structures formed within semiconductor integrated circuit microelectronic fabrications.

2. Description of the Related Art

Microelectronic fabrications are formed from microelectronic substrates over which are formed patterned microelectronic conductor layers which are separated by microelectronic dielectric layers.

Common in the art of microelectronic fabrication, and in particular in the art of semiconductor integrated circuit microelectronic memory fabrication, is the use and the fabrication of memory cell structures, and in particular dynamic random access memory (DRAM) cell structures. Dynamic random access memory (DRAM) cell structures typically comprise a field effect transistor (FET) device formed within and upon a semiconductor substrate, where one of a pair of source/drain regions within the field effect transistor (FET) device has formed thereover and electrically connected therewith a storage capacitor. Within a dynamic random access memory (DRAM) cell structure, a gate electrode within the field effect transistor (FET) device serves as a wordline which provides a switching function for charge introduction into and retrieval from the storage capacitor, while the other of the pair of source/drain regions within the field effect transistor (FET) device serves as a contact for a bitline conductor layer which introduces or retrieves charge with respect to the storage capacitor.

While the dynamic random access memory (DRAM) cell structure has clearly become ubiquitous in the art of semiconductor integrated circuit microelectronic fabrication, and is thus essential in the art of semiconductor integrated circuit microelectronic fabrication, the dynamic random access memory (DRAM) cell structure is nonetheless not entirely without problems in the art of semiconductor integrated circuit microelectronic fabrication.

In that regard, as semiconductor integrated circuit microelectronic fabrication integration levels have increased and semiconductor device and patterned conductor layer dimensions have decreased, it has become increasingly difficult in the art of semiconductor integrated circuit microelectronic fabrication, and in particular in the art of semiconductor integrated circuit microelectronic memory fabrication, to fabricate dynamic random access memory (DRAM) cell structures with decreased dimension and enhanced performance.

It is thus desirable in the art of microelectronic fabrication, and in particular in the art of semiconductor integrated circuit microelectronic memory fabrication, to provide methods and materials through which there may be fabricated memory cell structures with decreased dimensions and enhanced performance.

It is towards the foregoing object that the present invention is directed.

Various memory cell structures having desirable properties, and methods for fabrication thereof, have been disclosed in the art of semiconductor integrated circuit microelectronic fabrication.

Included among the memory cell structures, but not limited among the memory cell structures, is the memory cell structure disclosed within Huang, in U.S. Pat. No. 6,096,595 (a memory cell structure having formed therein a self aligned conductor contact structure interposed between a pair of polycide gate structures, where the memory cell structure is further integrated and embedded with respect to a metal oxide semiconductor (MOS) logic device structure having formed therein a salicide gate structure).

Desirable in the art of microelectronic fabrication, and in particular in the art of semiconductor integrated circuit microelectronic memory fabrication, are additional methods and materials which may be employed for fabricating memory cell structures of decreased dimensions and enhanced performance.

It is towards the foregoing object that the present invention is directed.

SUMMARY OF THE INVENTION

A first object of the invention is to provide a memory cell structure for use within a microelectronic fabrication.

A second object of the present invention is to provide a memory cell structure in accord with the first object of the present invention, wherein the memory cell structure may be fabricated with decreased dimensions and enhanced performance.

In accord with the objects of the present invention, there is provided by the present invention a method for fabricating a memory cell structure. To practice the method of the present invention, there is first provided a semiconductor substrate. There is then formed within and upon the semiconductor substrate a field effect transistor (FET) device comprising a gate dielectric layer formed upon the semiconductor substrate, a polysilicon gate electrode formed upon the gate dielectric layer, a sacrificial capping layer formed upon the polysilicon gate electrode, a pair of source/drain regions formed within the semiconductor substrate and separated by the gate electrode and a pair of spacer layers adjoining a pair of opposite edges of the gate electrode. There is then formed over the semiconductor substrate and passivating the field effect transistor (FET) device a passivating layer. There is then formed through the passivating layer, while employing the pair of spacer layers and the sacrificial capping layer as a mask, at least one self aligned contact via accessing at least one of the source/drain regions. There is then forming into the self aligned contact via a conductor stud layer. There is then stripped from over the substrate the passivating layer and the sacrificial capping layer to leave exposed a top surface of the polysilicon gate electrode separated from the conductor stud layer by one of the pair of spacer layers. Finally, there is then formed upon the exposed top surface of the gate electrode a silicide layer while employing a salicide method.

The present invention provides a memory cell structure for use within a microelectronic fabrication, wherein the memory cell structure may be fabricated with decreased dimensions and enhanced performance.

The present invention realizes the decreased dimensions of the memory cell structure by fabricating the memory cell structure with a self aligned conductor stud layer formed within a self aligned contact via. The present invention realizes the enhanced performance of the memory cell structure by forming upon a polysilicon gate electrode within the memory cell structure a silicide layer while employing a salicide method which provides the silicide layer with an decreased contact resistance in comparison with silicide layers formed other than by employing salicide methods.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a memory cell structure for use within a microelectronic fabrication, wherein the memory cell structure may be fabricated with decreased dimensions and enhanced performance.

The present invention realizes the decreased dimensions of the memory cell structure by fabricating the memory cell structure with a self aligned conductor stud layer formed within a self aligned contact via. The present invention realizes the enhanced performance of the memory cell structure by forming upon a polysilicon gate electrode within the memory cell structure a silicide layer while employing a salicide method.

While the preferred embodiment of the present invention illustrates the present invention most particularly within the context of forming an embedded dynamic random access memory (DRAM) cell structure with decreased dimensions and enhanced performance, the present invention may nonetheless also be employed for forming memory cell structures including but not limited to dynamic random access memory (DRAM) cell structures and static random access memory structures, either embedded (i.e., within surrounding logic circuitry) or not.

Referring now to FIG. 1 to FIG. 10, there is shown a series of schematic cross-sectional diagrams illustrating the results of progressive stages in forming, in accord with a preferred embodiment of the present invention, an embedded dynamic random access memory (DRAM) cell structure within a semiconductor integrated circuit microelectronic fabrication.

Figure 1:
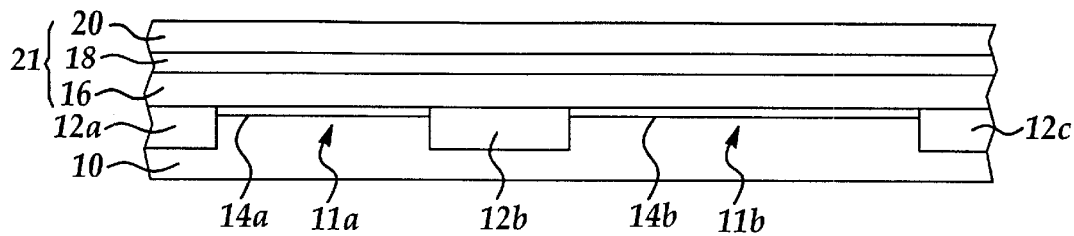
FIG. 1, FIG. 2, FIG. 3, FIG. 4, FIG. 5, FIG. 6, FIG. 7, FIG. 8, FIG. 9 and FIG. 10 show a series of schematic cross-sectional diagrams illustrating the results of progressive stages in forming, in accord with a preferred embodiment of the present invention, an embedded dynamic random access memory (DRAM) cell structure within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a series of isolation regions 12a, 12b and 12c which defines a pair of active regions 11a and 11b of the semiconductor substrate 10. Also illustrated within the schematic cross-sectional diagram of FIG. 1, and formed upon the pair of active regions 11a and 11b of the semiconductor substrate 10 is a corresponding pair of gate dielectric layers 14a and 14b.

As is understood by a person skilled in the art, within the present invention, including the claims, the semiconductor substrate 10 having formed therein the series of isolation regions 12a, 12b and 12c and having formed thereupon the pair of gate dielectric layers 14a and 14b is intended to serve as a horizontal reference plane upon or over which is formed additional vertically spaced layers when forming a memory cell structure in accord with the present invention. The semiconductor substrate 10 need not actually, however, be horizontally disposed when forming those additional vertically spaced layers thereover.

Within the preferred embodiment of the present invention with respect to the semiconductor substrate 10, and although semiconductor substrates are known in the art of semiconductor integrated circuit microelectronic fabrication with either dopant polarity, several dopant concentrations and various crystallographic orientations, for the preferred embodiment of the present invention, the semiconductor substrate 10 is typically and preferably a (100) silicon semiconductor substrate having at least either N- or P-doped regions.

Similarly, within the preferred embodiment of the present invention with respect to the series of isolation regions 12a, 12b and 12c, and although it is also known in the art of semiconductor integrated circuit microelectronic fabrication that isolation regions may be formed employing methods including but not limited to isolation regions thermal growth methods and isolation region deposition/patterning methods, for the preferred embodiment of the present invention the series of isolation regions 12a, 12b and 12c is, as is illustrated within the schematic cross-sectional diagram of FIG. 1, typically and preferably formed as shallow trench isolation (STI) regions. Typically and preferably, they are generally formed at least in part of a silicon oxide material formed recessed within the semiconductor substrate 10 to define a series of moats annularly surrounding a series of active regions, including the pair of active regions 11a and 11b, of the semiconductor substrate 10. The present invention may, however, also be practiced within the context of a semiconductor substrate having formed therein a series of isolation regions which is formed as local oxidation of silicon (LOCOS) isolation regions or deep trench isolation regions.

Within the preferred embodiment of the present invention with respect to the pair of active regions 11a and 11b of the semiconductor substrate 10, and as will become clearer within the context of additional description which follows, the active region 11a comprises a logic circuit region of the semiconductor substrate while the active region 11b comprises a memory cell region of the semiconductor substrate. Further in accord with the reference cited within the Description of the Related Art, the disclosure of which is incorporated herein fully by reference, it is generally desired to fabricated within the logic circuitry region logic devices primarily with enhanced performance, while it is generally desired to fabricate within the memory cell region memory devices and memory structures primarily with enhanced packing density.

Within the preferred embodiment of the present invention with respect to the pair of gate dielectric layers 14a and 14b, and although it is also known in the art of semiconductor integrated circuit microelectronic fabrication that gate dielectric layers may be formed employing thermal growth methods and deposition/patterning methods, for the preferred embodiment of the present invention, the pair of gate dielectric layers 14a and 14b is typically and preferably formed employing a thermal growth method to form the pair of gate dielectric layers 14a and 14b of thickness from about 15 to about 90 angstroms upon the corresponding active regions 11a and 11b of the semiconductor substrate 10.

Shown also within the schematic cross-sectional diagram of FIG. 1, and formed upon the series of isolation regions 12a, 12b and 12c and the pair of gate dielectric layers 14a and 14b is a series of three blanket layers. The series of three blanket layers consists of: (1) a blanket polysilicon layer 16 formed upon the series of isolation regions 12a, 12b and 12c and the pair of gate dielectric layers 14a and 14b; (2) a blanket first sacrificial capping layer 18 formed upon the blanket polysilicon layer 16; and (3) a blanket second sacrificial capping layer 20 formed upon the blanket first sacrificial capping layer 18. The foregoing three layers in an aggregate form a blanket gate electrode stack layer 21.

Within the preferred embodiment of the present invention with respect to the blanket polysilicon layer 16, the blanket polysilicon layer may be formed employing methods as are conventional in the art of microelectronic fabrication, to form the blanket polysilicon layer 16 of thickness from about 1000 to about 3000 angstroms.

Within the preferred embodiment of the present invention with respect to the blanket first sacrificial capping layer 18 and the blanket second sacrificial capping layer 20, the blanket first sacrificial capping layer 18 and the blanket second sacrificial capping layer 20 are typically and preferably formed of a pair of sacrificial capping materials having in general different etch characteristics. Thus although the blanket first sacrificial capping layer 18 and the blanket second sacrificial capping layer 20 may be formed from any of several pairs of materials, for practical purposes the blanket first capping layer 18 typically and preferably formed of a silicon oxide dielectric material formed to a thickness of from about 100 to about 1500 angstroms and the blanket second sacrificial capping layer 20 is formed of a silicon nitride dielectric material formed to a thickness of from about 500 to about 2000 angstroms.

Figure 2:
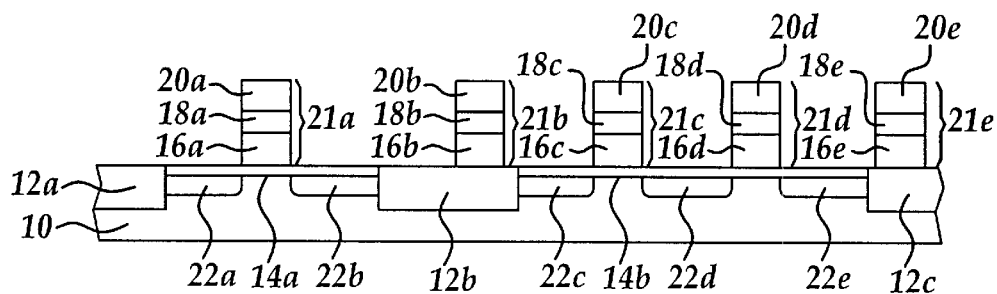

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket gate electrode stack layer 21 has been patterned to form a series of patterned gate electrode stack layers 21a, 21b, 21c, 21d and 21e comprising: (1) corresponding gate electrodes 16a, 16c or 16d or corresponding interconnect layers 16b or 16d; having formed thereupon (2) corresponding patterned first sacrificial capping layers 18a, 18b, 18c, 18d and 18e; having formed thereupon (3) corresponding patterned second sacrificial capping layers 20a, 20b, 20c, 20d and 20e.

Such patterning may be undertaken employing methods as are conventional in the art of semiconductor integrated circuit microelectronic fabrication, and in particular anisotropic plasma etch methods employing an appropriate sequence of etchant gas compositions, in conjunction with a photomask layer which is not otherwise illustrated within the schematic cross-sectional diagram of FIG. 2.

Finally, there is also shown within the schematic cross-sectional diagram of FIG. 2 a series of lightly doped source/drain regions 22a, 22b, 22c, 22d and 22e formed into the active regions 11a and 11b of the semiconductor substrate 10 and separated by the series of gate electrodes 16a, 16c and 16d.

Within the present invention, the series of lightly doped source/drain regions 22a, 22b, 22c, 22d and 22e may be formed employing ion implant methods as are conventional in the art of semiconductor integrated circuit microelectronic fabrication, to provide the series of lightly doped source/drain regions 22a, 22b, 22c, 22d and 22e of an appropriate dopant at a concentration of from about 1E19 to about 1E20 dopant atoms per cubic centimeter.

Figure 3:
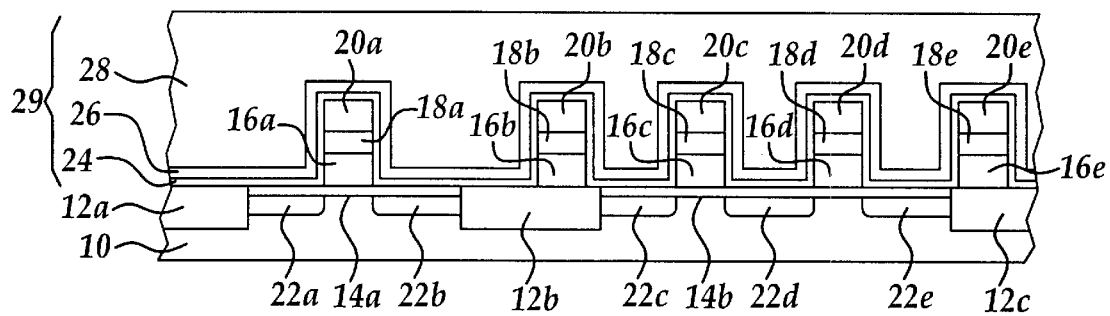

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein there is formed over the semiconductor substrate 10 and passivating the series of patterned gate electrode stack layers 21a, 21b, 21c, 21d and 21e a series of three blanket layers. The series of three blanket layers comprises: (1) a blanket conformal first spacer layer 24; (2) a blanket conformal second spacer layer 26; and (3) a blanket planarizing passivating layer 28, which in an aggregate form a blanket passivating/spacer stack layer 29.

Within the preferred embodiment of the present invention, and although other materials combinations may also be employed for forming the foregoing series of blanket layers: (1) the blanket conformal first spacer layer 24 is typically and preferably formed of a silicon oxide dielectric material formed to a thickness of from about 50 to about 400 angstroms; (2) the blanket conformal second spacer layer 26 is typically and preferably formed of a silicon nitride dielectric material formed to a thickness of from about 100 to about 500 angstroms; and (3) the blanket planarizing passivating layer 28 is typically and preferably formed of a doped silicate glass dielectric material formed to a thickness of from about 4000 to about 8000 angstroms.

As is further understood by a person skilled in the art, it is also feasible within the present invention to anisotropically etch the blanket conformal second spacer layer 26 and the blanket conformal first spacer layer 24 to form separated patterned spacer layers, prior to forming thereupon the blanket planarizing passivating layer 28.

Figure 4:
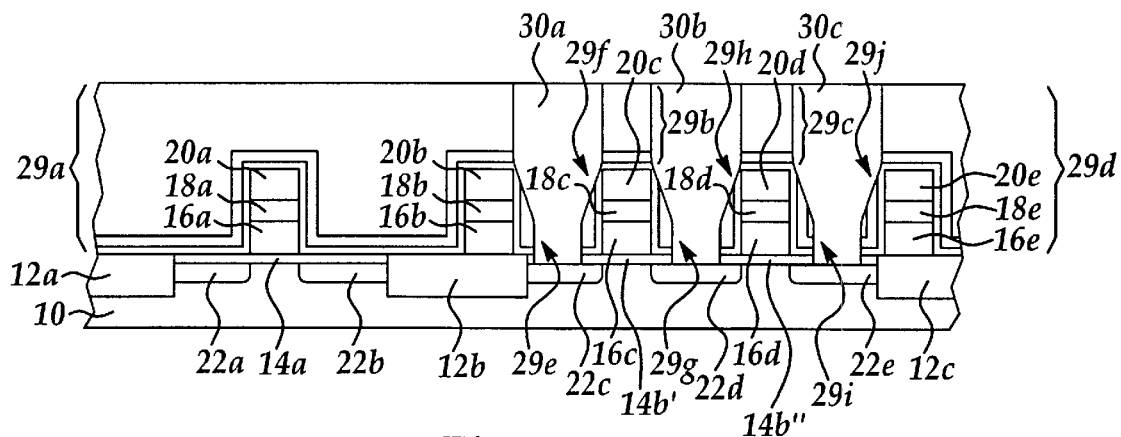

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, there is formed accessing each of the lightly doped source/drain regions 22c, 22d and 22e a contact via formed employing a self aligned method. The series of contact vias is formed while etching the blanket passivating/ stack layer 29 to form a series of patterned passivating/stack layers 29a, 29b, 29c and 29d. Incident to such etching, there is also formed a series spacer layers 29e, 29f, 29g, 29h, 29i and 29j formed within the series of contact vias. Each of the series of spacer layers 29e, 29f, 29g, 29h, 29i and 29j typically and preferably has a horizontal linewidth adjoining a gate electrode 16c or 16d, or an interconnect 16b or 16e, of from about 0.03 to about 0.09 microns. Such etching may be undertaken employing anisotropic etching methods as are conventional in the art of semiconductor integrated circuit microelectronic fabrication.

Finally, there is also shown within the schematic cross-sectional diagram of FIG. 4 a series of conductor stud layers 30a, 30b and 30c formed into the series of contact vias.

Within the preferred embodiment of the present invention, the series of conductor stud layers 30a, 30b and 30c may be formed from any of several conductor materials, including but not limited to metal, metal alloy, doped polysilicon and polycide conductor materials, but will typically and preferably be formed of doped polysilicon (having a dopant concentration of greater than about 1E20 dopant atoms per cubic centimeter) conductor materials.

Figure 5:
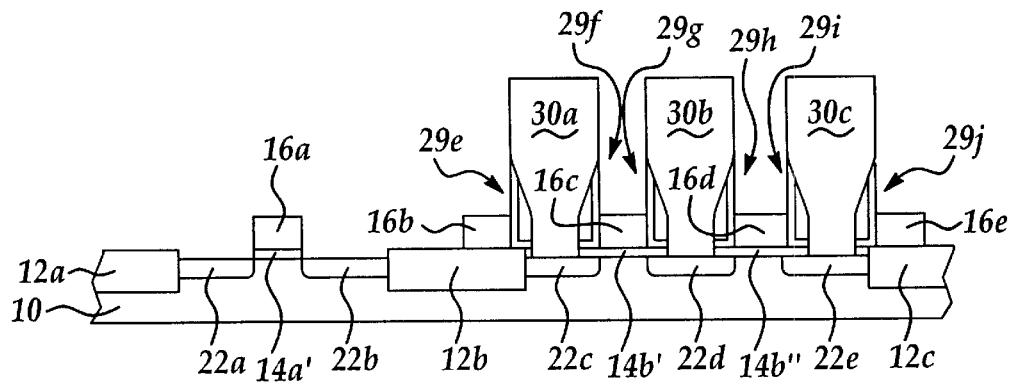

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there has been stripped from the semiconductor integrated circuit microelectronic fabrication: (1) the series of patterned passivating/spacer stack layers 29a, 29b, 29c and 29d; (2) the series of patterned second masking layers 20a, 20b, 20c, 20d and 20e; and (3) the series of patterned first masking layers 18a, 18b, 18c, 18d and 18e, to leave remaining the series of gate electrodes 16a, 16c and 16d and the pair of interconnects 16b and 16e, the last four of which are separated from the series of conductor contact studs 30a, 30b and 30c by the series of spacer layers 29e, 29f, 29g, 29h, 29i and 29j.

Within the preferred embodiment of the present invention, the foregoing series of layers may be stripped while employing, as appropriate, isotropic etchants (generally employed first) and anisotropic etchants (generally employed second such as to preserve the integrity of the series of spacer layers 29e, 29f, 29g, 29h, 29i and 29j) with appropriate specificity with respect to the individual materials from which are formed the foregoing layers. Within the present invention, it is desired to leave the series of spacer layers 29e, 29f, 29g, 29h, 29i and 29j remaining interposed between: (1) the pair of gate electrodes 16c and 16d and the pair of interconnect layers 16b and 16e; and (2) the series of conductor contact studs 30a, 30b and 30c.

Figure 6:
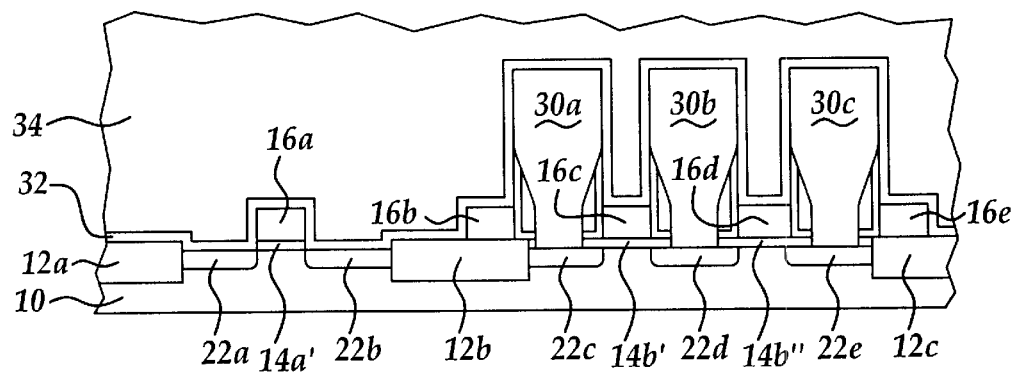

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there is formed upon the semiconductor integrated circuit microelectronic fabrication a blanket conformal liner layer 32 in turn having formed thereupon a blanket planarizing sacrificial layer 34.

Within the preferred embodiment of the present invention, and although the blanket conformal liner layer 32 may be formed from any of several liner materials, including but not limited to silicon oxide materials, silicon nitride materials and silicon nitride materials, the blanket conformal liner layer 32 is typically and preferably formed of a silicon nitride material or a silicon oxynitride material. Typically and preferably, the blanket conformal liner layer 32 is formed to a thickness of from about 50 to about 400 angstroms.

Similarly, although the blanket planarizing sacrificial layer 34 may also be formed from any of several sacrificial materials, including sacrificial conductor materials, sacrificial semiconductor materials and sacrificial dielectric materials, for the preferred embodiment of the present invention, the blanket planarizing sacrificial layer 34 is typically and preferably formed of a sacrificial and planarizing photoresist material.

Figure 7:
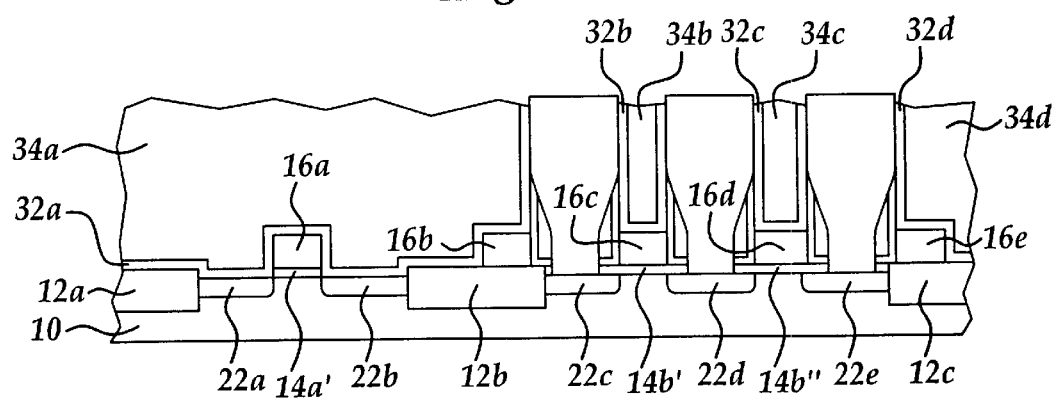

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein: (1) the blanket planarizing sacrificial layer 34 has been etched back to form a series of patterned planarizing sacrificial layers 34a, 34b, 34c and 34d which leave exposed top surface portions of the blanket conformal liner layer 32 over the series of conductor contact studs 30a, 30b and 30c; (2) the exposed top surface portions of the blanket conformal liner layer 32 over the series of conductor contact studs 30a, 30b and 30c are stripped to form a series of patterned conformal liner layers 32a, 32b, 32c and 32d exposing the top surface portions of the series of conductor contact studs 30a, 30b and 30c.

Within the preferred embodiment of the present invention, the blanket planarizing sacrificial layer 34 when formed of a sacrificial planarizing photoresist material may be etched back to form the series of patterned planarizing sacrificial layers 34a, 34b, 34c and 34d while employing an oxygen containing etchback plasma. Similarly, the top surface portions of the blanket conformal liner layer 32 when formed of a silicon nitride material may be etched away to form the series of patterned conformal liner layers 32a, 32b, 32c and 32d while employing a phosphoric acid etchant.

Figure 8:
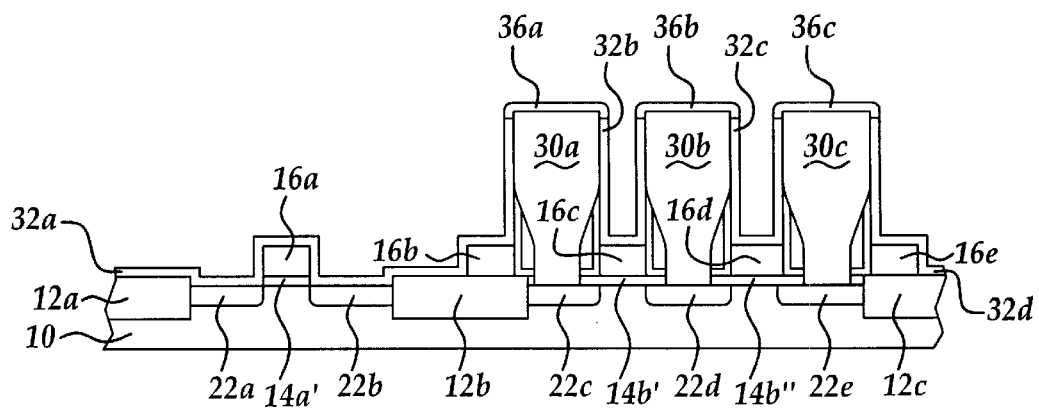

Referring now to FIG. 8, there is shown a schematic cross-sectional diagram illustrating the results of further processing of the semiconductor integrated circuit whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein, in a first instance, there is stripped from the semiconductor integrated circuit microelectronic fabrication the series of patterned planarizing sacrificial layers 34a, 34b, 34c and 34d.

The series of patterned planarizing sacrificial layers 34a, 34b, 34c and 34d may be stripped employing methods and materials as are conventional in the art of semiconductor integrated circuit microelectronic fabrication.

Similarly, there is also shown within the schematic cross-sectional diagram of FIG. 8 formed upon each of the series of conductor contact studs 30a, 30b and 30c a patterned capping dielectric layer 36a, 36b or 36c.

Within the preferred embodiment of the present invention, the series of patterned capping dielectric layers 36a, 36b and 36c is typically and preferably formed employing a thermal oxidation of the polysilicon material from which is preferably formed the series of conductor contact studs 30a, 30b and 30c.

Figure 9:
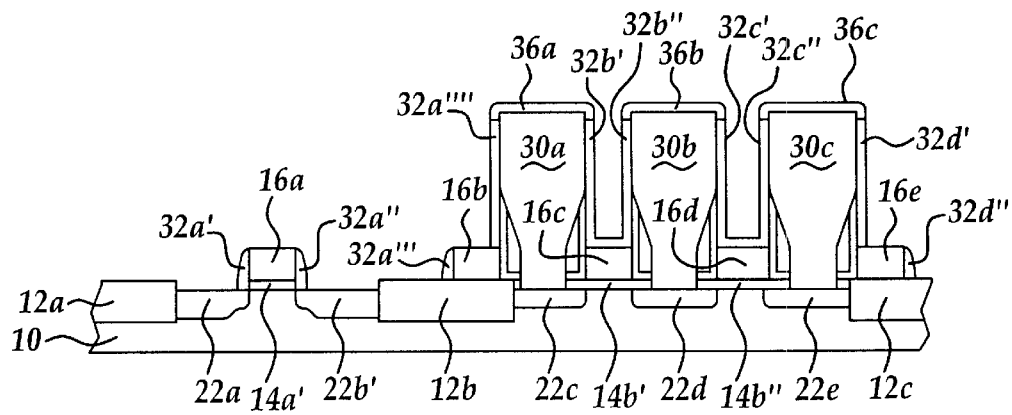

Referring now to FIG. 9, there is shown a schematic cross-sectional diagram illustrating the results of further processing of the semiconductor integrated circuit microelectronic fabrication whose schematic cross-sectional diagram is illustrated in FIG. 8.

Shown in FIG. 9 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 8, but wherein the series of patterned conformal liner layers 32a, 32b, 32c and 32d has been anisotropically etched to form therefrom a series of spacer layers 32a', 32a''', 32a''', 32a'''', 32b', 32b'', 32c', 32c'', 32d' and 32d''.

Such anisotropic etching may be undertaken employing methods as are conventional in the art of microelectronic fabrication.

Similarly, there is also shown within the schematic cross-sectional diagram of FIG. 9 a pair of heavily doped source/drain regions 22a' and 22b' formed from, and incorporating therein, the pair of lightly doped source/drain regions 22a' and 22b as illustrated within the schematic cross-sectional diagram of FIG. 8. The pair of heavily doped source/drain regions 22a' and 22b' may be formed while similarly also employing higher dose ion implant methods and dopant materials as are conventional in the art of semiconductor integrated circuit microelectronic fabrication.

Figure 10:
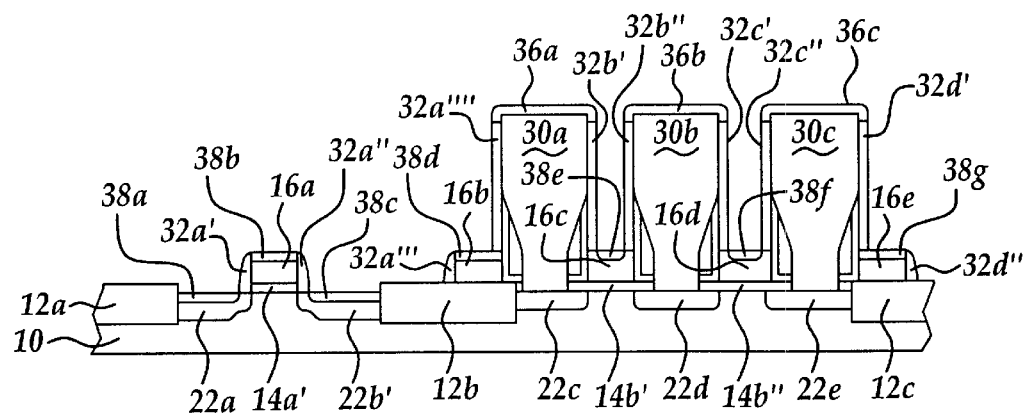

Referring now to FIG. 10, there is shown a schematic cross-sectional diagram illustrating the results of further processing of the semiconductor integrated circuit microelectronic fabrication whose schematic cross-sectional diagram is illustrated in FIG. 9.

Shown in FIG. 10 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 9, but wherein there is formed upon the top surfaces of the series of heavily doped source/drain regions 22a' and 22b', the series of gate electrodes 16a, 16c and 16d, and the pair of interconnects 16b and 16e, a series of silicide layers 38a, 38b, 38c, 38d, 38e, 38f and 38g formed employing a self aligned method. As is understood by a person skilled in the art, the self aligned method employs: (1) forming a blanket metal silicide forming metal layer conformally upon the semiconductor integrated circuit microelectronic fabrication whose schematic cross-sectional diagram is illustrated in FIG. 9; (2) thermally annealing the semiconductor substrate to form the metal silicide layers 38a, 38b, 38c, 38d, 38e, 38f and 38g where the metal silicide forming metal layer contacts a silicon (monocrystalline or polycrystalline) material; and (3) dissolving away the remaining unreacted metal silicide forming metal layer. Within the preferred embodiment of the present invention the foregoing metal silicide layers 38a, 38b, 38c, 38d, 38e, 38f and 38g are preferably formed of cobalt silicide or nickel silicide, and formed to a thickness of from about 100 to about 500 angstroms, although other silicides, such as but not limited to titanium, tungsten, platinum and molybdenum silicides, are also feasible within the present invention.

As is understood by a person skilled in the art, the semiconductor integrated circuit microelectronic fabrication whose schematic cross-sectional diagram is illustrated in FIG. 10 may be further fabricated to form a fully functional semiconductor integrated circuit microelectronic fabrication. In so doing there will typically and preferably be formed capacitor structures electrically connected to the pair of conductor contact studs 30a and 30c, and a bitline conductor layer connected with the conductor contact stud 30b, to thus formed within the memory cell region of the semiconductor integrated circuit microelectronic fabrication a memory cell. Similarly, the field effect transistor (FET) device formed within the logic device region of the semiconductor integrated circuit microelectronic fabrication may be connected and interconnected, as appropriate, for proper functioning of the semiconductor integrated circuit microelectronic fabrication within which it is formed.

Upon forming the semiconductor integrated circuit microelectronic fabrication whose schematic cross-sectional diagram is illustrated in FIG. 10, there is formed in accord with the preferred embodiment of the present invention a semiconductor integrated circuit microelectronic fabrication having formed therein a memory cell structure with decreased dimensions and enhanced performance. The memory cell structure is formed with decreased dimensions insofar as the memory cell structure is formed with self aligned contact structures. Similarly, the memory cell structure us formed with enhanced performance insofar as a gate electrode within the memory cell structure is formed with a silicide layer formed employing a salicide (i.e., self-aligned) method which provides the silicide layer with a lower contact resistance than if formed employing other than the salicide method.

As is understood by a person skilled in the art, the preferred embodiment of the present invention is illustrative of the present invention rather than limiting of the present invention. Revisions and modifications may be made to methods, materials, structures and dimensions through which is provided a semiconductor integrated circuit microelectronic fabrication in accord with the preferred embodiment of the present invention, while still providing a method for fabricating a memory cell structure in accord with the present invention, further in accord with the accompanying claims.

What is claimed is:

1. A method for fabricating a memory cell structure comprising:

providing a semiconductor substrate;

forming within and upon the semiconductor substrate a field effect transistor (FET) device comprising a gate dielectric layer formed upon the semiconductor substrate, a polysilicon gate electrode formed upon the gate dielectric layer, a sacrificial capping layer formed upon the polysilicon gate electrode, a pair of source/drain regions formed within the semiconductor substrate and separated by the gate electrode and a pair of spacer layers adjoining a pair of opposite edges of the gate electrode, said layer separates the polysilicon gate electrode from the conductor stud layer by a horizontal distance of from about 0.03 to about 0.09 microns;

forming over the semiconductor substrate and passivating the field effect transistor (FET) device a passivating layer;

forming through the passivating layer, while employing the pair of spacer layers and the sacrificial capping layer as a mask, at least one self aligned contact via accessing at least one of the pair of source/drain regions;

forming into the self aligned contact via a conductor stud layer;

stripping from over the substrate the passivating layer and the sacrificial capping layer to leave exposed a top surface of the polysilicon gate electrode separated from the conductor stud layer by one of the pair of spacer layers; and forming upon the exposed top surface of the gate electrode a silicide layer while employing a salicide method.

2. The method of claim 1 wherein the memory cell structure is a dynamic random access memory cell structure.

3. The method of claim 1 wherein the memory cell structure is a static random access memory cell structure.

4. A method for fabricating a memory cell structure comprising:

providing a semiconductor substrate;

forming within and upon the semiconductor substrate a field effect transistor (FET) device comprising a gate dielectric layer formed upon the semiconductor substrate, a polysilicon gate electrode formed upon the gate dielectric layer, a sacrificial capping layer formed upon the polysilicon gate electrode, a pair of source/drain regions formed within the semiconductor substrate and separated by the gate electrode and a pair of spacer layers adjoining a pair of opposite edges of the gate electrode;

forming over the semiconductor substrate and passivating the field effect transistor (FET) device a passivating layer;

forming through the passivating layer, while employing the pair of spacer layers and the sacrificial capping layer as a mask, at least one self aligned contact via accessing at least one of the pair of source/drain regions;

forming into the self aligned contact via a conductor stud layer;

stripping from over the substrate the passivating layer and the sacrificial capping layer to leave exposed a top surface of the polysilicon gate electrode separated from the conductor stud layer by one of the pair of spacer layers; and forming upon the exposed top surface of the gate electrode a silicide layer to a thickness of from about 100 to about 500 angstroms while employing a salicide method.

5. The method of claim 1 wherein the silicide layer is selected from the group consisting of cobalt silicide layers and nickel silicide layers.

6. The method of claim 1 wherein the silicide layer is selected from the group consisting of titanium silicide layers, tungsten silicide layers, platinum silicide layers and molybdenum silicide layers.

7. A method for fabricating a memory cell structure comprising:

providing a semiconductor substrate having a memory cell region and a logic circuitry region;

forming within and upon the memory cell region of the semiconductor substrate a field effect transistor (FET) device comprising a gate dielectric layer formed upon the semiconductor substrate, a polysilicon gate electrode formed upon the gate dielectric layer, a sacrificial capping layer formed upon the polysilicon gate electrode, a pair of source/drain regions formed within the semiconductor substrate and separated by the gate electrode and a pair of spacer layers adjoining a pair of opposite edges of the gate electrode;

forming over the memory cell region of the semiconductor substrate and passivating the field effect transistor (FET) device a passivating layer;

forming through the passivating layer, while employing the pair of spacer layers and the sacrificial capping layer as a mask, at least one self aligned contact via accessing at least one of the source/drain regions;

forming into the self aligned contact via a conductor stud layer;

stripping from over the substrate the passivating layer and the sacrificial capping layer to leave exposed a top surface of the polysilicon gate electrode separated from the conductor stud layer by one of the pair of spacer layers; and forming upon the exposed top surface of the gate electrode a silicide layer while employing a salicide method, said silicide layer is selected from the group consisting of cobalt silicide layers and nickel silicide layers.

8. The method of claim 7 wherein the memory cell structure is a dynamic random access memory cell structure.

9. The method of claim 7 wherein the memory cell structure is a static random access memory cell structure.

10. The method of claim 7 wherein spacer layer separates the polysilicon gate electrode from the conductor stud layer by a horizontal distance of from about 0.03 to about 0.09 microns.

11. The method of claim 7 wherein the silicide layer is formed to a thickness of from about 100 to about 500 angstroms.

12. The method of claim 7 wherein the silicide layer is selected from the group consisting of titanium silicide layers, tungsten silicide layers, platinum silicide layers and molybdenum silicide layers.

* * * * *